(12) United States Patent
Lee et al.

(10) Patent No.: US 8,502,348 B2
(45) Date of Patent: Aug. 6, 2013

(54) DIFFERENTIAL VARACTOR DEVICE

(75) Inventors: Yue-Shiun Lee, Taipei (TW);
Cheng-Hsiung Chen, Taipei (TW);
Meng-Fan Wang, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 82 days.

(21) Appl. No.: 13/178,506

(22) Filed: Jul. 8, 2011

(65) Prior Publication Data
US 2013/0009228 A1    Jan. 10, 2013

(51) Int. Cl.
*H01L 29/93* (2006.01)
(52) U.S. Cl.
USPC ............ 257/595; 257/E27.049; 257/E29.344; 438/379
(58) Field of Classification Search
USPC .................. 438/379; 327/586; 257/312, 595, 257/E21.364, E27.049, E29.344
See application file for complete search history.

(56) References Cited

U.S. PATENT DOCUMENTS

| 6,943,399 | B1 * | 9/2005 | Gau ............................ 257/312 |
| 7,026,880 | B2 | 4/2006 | Shi et al. |
| 7,223,667 | B2 * | 5/2007 | Tseng .......................... 438/379 |
| 7,378,901 | B2 | 5/2008 | Chung |
| 2006/0006431 | A1 * | 1/2006 | Jean et al. ..................... 257/288 |

OTHER PUBLICATIONS

P. VanDerVoorn, 2010 Symposium on VLSI Technology Digest of Technical Papers, "A 32nm Low Power RF CMOS SOC Technology Featuring High-k/Metal Gate", 2010.

* cited by examiner

*Primary Examiner* — David Vu
(74) *Attorney, Agent, or Firm* — Winston Hsu; Scott Margo

(57) ABSTRACT

The present invention provides a differential varactor device including a substrate having a first conductive type, a well having a second conductive type, five doped regions having the second conductive type, a first gate, a second gate, a third gate, and a fourth gate. The well is disposed in the substrate, and the doped regions are disposed in the well and arranged along a direction. The first gate, the second gate, the third gate and the fourth gate are respectively disposed on the well between any two of the adjacent doped regions, and are arranged sequentially along the direction.

9 Claims, 6 Drawing Sheets

DIFFERENTIAL VARACTOR DEVICE

BACKGROUND OF THE INVENTION

1. Field of the Invention

The present invention relates to a differential varactor device.

2. Description of the Prior Art

In the modern information industry, all kinds of data, information, video, and so on are all transmitted electronically; therefore, a processing circuit for dealing with electronic signals becomes one of the most important foundations of modern information business. An oscillator is an indispensable circuit block for modern digital circuits. For example, in common information systems (such as a personal computer), a global clock is required to coordinate all digital circuits in the system, so an oscillator for generating clock is required. In addition, to synchronize circuits with different clocks, phase loop lock (PLL) circuits are needed, and a precise voltage-controlled oscillator (VCO) is essential for the PLL to generate different frequencies of signals. In VCOs, the frequency of the VCO is controlled by an applied current or voltage. Furthermore, in some precise filters, resistor-capacitor (RC) filters, in which the filter frequency can be adjusted, are utilized frequently.

With the filter characteristic of an RC filter and the oscillation characteristic of an inductance-capacitor (LC) oscillator, it is possible to adjust each of them by modifying the capacitance value. In devices with those characteristics, capacitors with variable capacitances, which are varactor structures, are used. The capacitance of a varactor structure, when within its operating parameters, decreases as a voltage applied to the device (the control voltage) increases. Numerous varactor structures have been developed and are employed in integrated circuit technologies. Among them, PN junction varactor structures and metal-oxide-semiconductor (MOS) varactor structures are commonly used.

However, regarding the MOS varactor, the tuning ratio, which is defined as a ratio of the largest capacitance and the smallest capacitance of the MOS varactor, only is 3 in the operating frequency of 10 GHz. In other words, the range of the adjustable capacitance of the MOS varactor is limited by the tuning ratio. Therefore, to increase the tuning ratio of the varactor is an important objective in this field.

SUMMARY OF THE INVENTION

It is therefore an objective of the present invention to provide a differential varactor device to increase the tuning ratio.

According to a preferred embodiment, a differential varactor device is disclosed. The differential varactor device includes a substrate, a well, five first doped regions, and a first gate, a second gate, a third gate and a fourth gate. The substrate has a first conductive type. The well is disposed in the substrate, and the well has a second conductive type. The first doped regions are disposed in the well and arranged in a first direction, and the first doped regions have the second conductive type. The first gate, the second gate, the third gate and the fourth gate are respectively disposed on the well between any two of the adjacent first doped regions, and arranged sequentially in the first direction.

According to another preferred embodiment, a differential varactor device is disclosed. The differential varactor device includes a substrate, a first well and a second well, three third doped regions, three fourth doped regions, a first gate and a second gate, and a third gate and a fourth gate. The substrate has a first conductive type. The first well and the second well are disposed in the substrate and arranged sequentially in a first direction, and the first well and the second well have a second conductive type. The third doped regions are disposed in the first well and arranged in the first direction, and the third doped regions have the second conductive type. The fourth doped regions are disposed in the second well and arranged in the first direction, and the fourth doped regions have the second conductive type. The first gate and the second gate are disposed on the first well and located between any two of the third doped regions respectively, and the first gate and the second gate are arranged sequentially in the first direction. The third gate and the fourth gate are disposed on the second well and located between any two of the fourth doped regions respectively, and the third gate and the fourth gate are arranged sequentially in the first direction.

According to another preferred embodiment, a differential varactor device is disclosed. The differential varactor device includes a plurality of differential varactor units. The differential varactor units respectively have two gates, and the gates of each differential varactor unit are electrically connected to a first output terminal and a second output terminal respectively, wherein the differential varactor device have a tuning ratio, and the tuning ratio is larger than 4.

In the differential varactor device of the present invention, the gates electrically connected to different gate voltages are arranged alternatively in a direction, and the different differential varactor units are disposed in the same well, so the tuning ratio of the differential varactor device can be larger than 4, and the adjustable capacitance range of the differential varactor device can be effectively increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
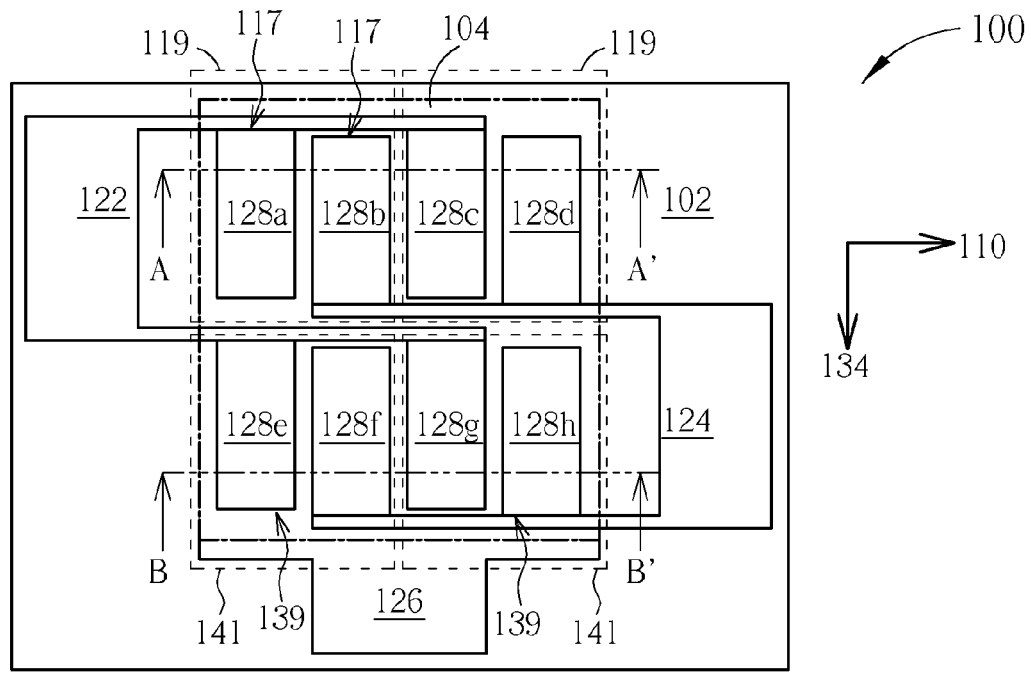
FIG. 1 is a schematic diagram illustrating a top view of a differential varactor device according to a first preferred embodiment of the present invention.
Figure 2:
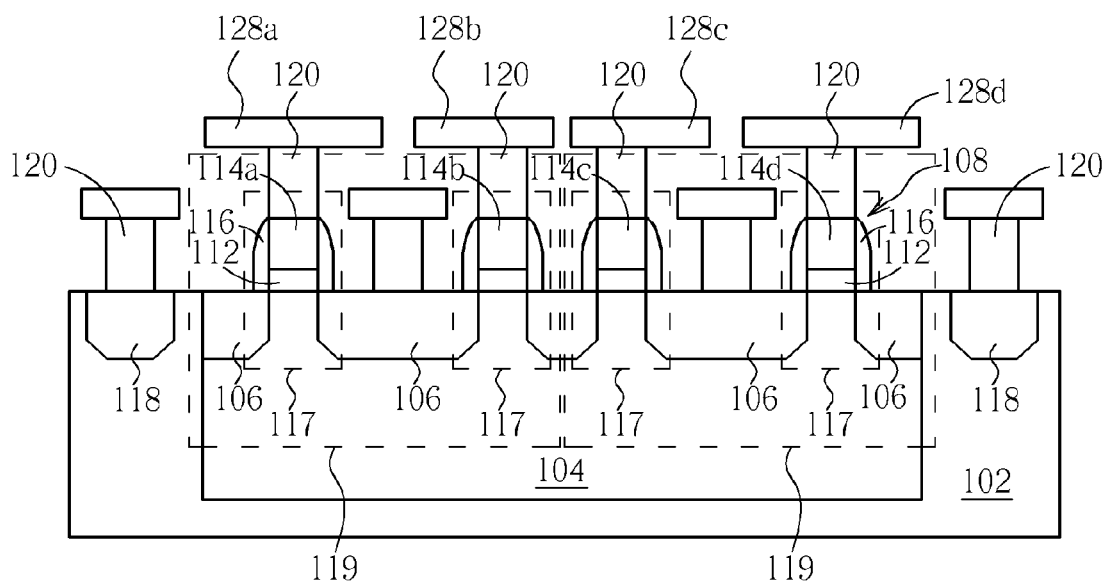
FIG. 2 is a schematic diagram illustrating a cross section of FIG. 1 along a cross-sectional line AA'.
Figure 3:
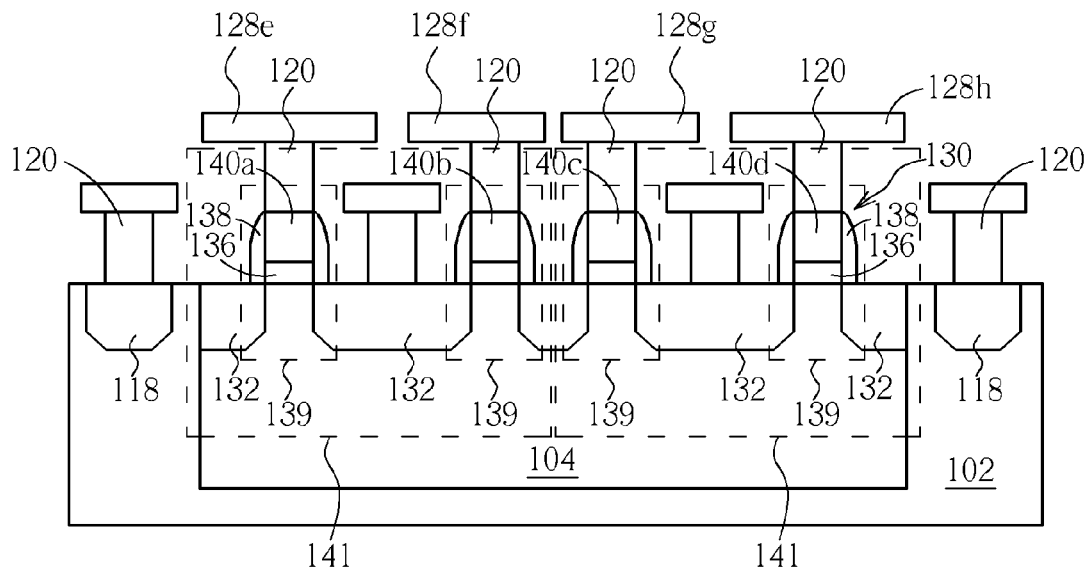
FIG. 3 is a schematic diagram illustrating a cross section of FIG. 1 along a cross-sectional line BB'.

Please refer to FIG. 1 through FIG. 3. FIG. 1 is a schematic diagram illustrating a top view of a differential varactor device according to a first preferred embodiment of the present invention. FIG. 2 is a schematic diagram illustrating a cross section of FIG. 1 along a cross-sectional line AA', and FIG. 3 is a schematic diagram illustrating a cross section of FIG. 1 along a cross-sectional line BB'. As shown in FIG. 1 and FIG. 2, the differential varactor device 100 is fabricated on a substrate 102, such as silicon substrate, and the substrate 102 has a first conductive type. The differential varactor device 100 includes a well 104, five first doped region 106, and four first gate structures 108. The well region 104 is disposed in the substrate 102, and has a second conductive type different from the first conductive type. The first doped regions 106 are disposed in the well 104 and arranged along a first direction 110, and the first doped region 106 has the second conductive type. In this embodiment, the first conductive type is P type, and the second conductive type is N type, but is not limited herein. The first conductive type and the second conductive type of the present invention also can be exchanged.

In this embodiment, the first gate structure 108 is disposed on the N-type well 104 between any two of the adjacent N-type first doped region 106 respectively, and each first gate structure 108 includes a first insulating layer 112, a gate, and two first spacers 116. Each gate is respectively disposed on each first insulating layer 112, and the first spacers 116 are respectively disposed on two sides of each gate and each first insulating layer 112. The N-type well 104, any two of the adjacent N-type first doped regions 106 and each first gate structure 108 disposed between any two of the adjacent N-type first doped regions 106 constitute a first varactor, and four first varactors are exemplified in FIG. 2. Furthermore, two adjacent first varactors share the same one N-type first doped region 106. In addition, each gate in this embodiment is respectively composed of a polysilicon layer, but is not limited to this. Each gate of the present invention also can be a metal gate.

In this embodiment, the gates of the first gate structures 108 can be divided into a first gate 114a, a second gate 114b, a third gate 114c, and a fourth gate 114d that are arranged sequentially in the first direction 110. Furthermore, the differential varactor device 100 further includes a plurality of P-type doped regions 118, a plurality of contact plugs 120, a plurality of conductive layers, a first output terminal 122, a second output terminal 124, and a third output terminal 126. The P-type doped regions 118 are disposed in the P-type substrate 102, and are used to electrically connect the P-type substrate 102 to the outside. The contact plugs 120, the conductive layers, the first output terminal 122, the second output terminal 124 and the third output terminal 126 are disposed on the P-type substrate 102, and the contact plugs 120 are respectively disposed on the P-type doped region 118, the first gate 114a, the second gate 114b, the third gate 114c, the fourth gate 114d and a part of the N-type first doped regions 106. The conductive layers include a first conductive layer 128a, a second conductive layer 128b, a third conductive layer 128c, and a fourth conductive layer 128d, which are respectively disposed on the first gate 114a, the second gate 114b, the third gate 114c and the fourth gate 114d. The first conductive layer 128a, the second conductive layer 128b, the third conductive layer 128c and the fourth conductive layer 128d are electrically connected to the first gate 114a, the second gate 114b, the third gate 114c and the fourth gate 114d respectively by the contact plugs 120. In addition, the first conductive layer 128a and the third conductive layer 128c are electrically connected to the first output terminal 122, so the first gate 114a and the third gate 114c can be electrically connected to the first output terminal 122 through the first conductive layer 128a, the third conductive layer 128c and the corresponding contact plugs 120; and the second conductive layer 128b and the fourth conductive layer 128d are electrically connected to the second output terminal 124, so the second gate 114b and the fourth gate 114d can be electrically connected to the second output terminal 124 through the second conductive layer 128b, the fourth conductive layer 128d and the corresponding contact plugs 120. The N-type first doped regions 106 can be electrically connected to the third output terminal 126 through the contact plugs 120, and for example, the N-type first doped region 106 disposed between the first gate 114a and the second gate 114b and the N-type first doped region 106 disposed between the third gate 114c and the fourth gate 114d are in contact with the corresponding contact plugs 120 so as to be electrically connected to the third output terminal 126. The first output terminal 122 and the second output terminal 124 can serve as different gate output terminals of the different varactor device 100, so that the first output terminal 122 and the second output terminal 124 can be electrically connected to two different gate voltages. The third output terminal 126 serves as a control terminal of the differential varactor device 100, so that the third output terminal 126 can be electrically connected to a control voltage. As we can see from the above-mentioned description, any two first varactor 117 electrically connected to different gate voltages can constitute a first differential varactor unit 119, and the differential varactor device 100 has two first differential varactor units 119 electrically connected to each other in parallel and arranged in first direction 100 in this embodiment. In other embodiments of the present invention, the differential varactor device 100 further can include a fourth output terminal, electrically connected to the P-type doped regions 118 through the contact plugs 120, and the fourth output terminal can serve as the output terminal of the P-type substrate 102. Furthermore, in the present invention, the method for electrically connecting the first gate 114a and the third gate 114b to the first output terminal 122, the method for electrically connecting the second gate 114b and the fourth gate 114d to the second output terminal 124, the method for electrically connecting the N-type first doped region 106 to the third output terminal 126, and the method for electrically connecting the P-type doped region 118 to the fourth output terminal are not limited to the above-mentioned methods, and can be performed by utilizing other metal interconnect or buried line structures.

As shown in FIG. 3, the differential varactor device 100 can further include four second gate structures 130 and five N-type second doped regions 132. The second gate structures 130 are disposed on the N-type well 104 adjacent to the first gate structures 108 and disposed between any two of the adjacent N-type second doped regions 132 respectively. The second gate structures 130 and the first gate structures 108 are arranged in a second direction. Each second gate structure 130 includes a second insulating layer 136, a gate, and two second spacers 138, and each gate is respectively disposed on each second insulating layer 136. The second spacers 138 are respectively disposed at two sides of each gate and each second insulating layer 136. Thus, the N-type well 104, any two of the adjacent N-type second doped region 132, and each second gate structure disposed between any two of the adjacent N-type second doped region 132 can constitute a second varactor 139, and two adjacent second varactors share the same one N-type second doped region 132. In this embodiment, the gates of the second gate structures 130 can be divided into a fifth gate 140a, a sixth gate 140b, a seventh gate 140c, and an eighth gate 140d, which are arranged sequentially in the first direction 110. In addition, the conductive layers further include a fifth conductive layer 128e, a sixth conductive layer 128f, a seventh conductive layer 128g, and an eighth conductive layer 128h, disposed on the fifth gate 140a, the sixth gate 140b, the seventh gate 140c and the eighth gate 140d respectively. The fifth conductive layer 128e, the sixth conductive layer 128f, the seventh conductive layer 128g and the eighth conductive layer 128h are electrically connected to the fifth gate 140a, the sixth gate 140b, the seventh gate 140c and the eighth gate 140d respectively through the corresponding contact plugs 120. Furthermore, the fifth conductive layer 128e and the seventh conductive layer 128g are electrically connected to the first output terminal 122, so the fifth gate 140a and the seventh gate 140c can be electrically connected to the first output terminal 122 through the fifth conductive layer 128e, the seventh conductive layer 128g, and the corresponding contact plugs 120. The sixth conductive layer 128f and the eighth conductive layer 128h are electrically connected to the second output terminal 124, so the sixth gate 140b and the eighth gate 140d can be electrically connected to the second output terminal 124 through the sixth conductive layer 128f, the eighth conductive layer 128h, and the corresponding contact plugs 120. The N-type second doped region 132 disposed between the fifth gate 140a and the sixth gate 140b and the N-type second doped region 132 disposed between the seventh gate 140c and the eighth gate 140d are in contact with the corresponding contact plugs 120 so as to be electrically connected to the third output terminal 126.

As the above-mentioned description, any two second varactors 139 electrically connected to different gate voltages constitute a second differential varactor unit 141, and the differential varactor device 100 has two second differential varactor units 141 electrically connected to each other in parallel and arranged in the first direction 110. Furthermore, the first gate 114a and the third gate 114c of the first differential varactor units 119 and the fifth gate 140a and the seventh gate 140c of the second differential varactor units 141 are electrically connected in parallel to the first output terminal 122, and the second gate 114b and the fourth gate 114d of the first differential varactor units 119 and the sixth gate 140b and the eighth gate 140d of the second differential varactor units 141 are electrically connected in parallel to the second output terminal 124. The first differential varactor units 119 and the second differential varactor units 141 are arranged in the second direction 134 and disposed on the same N-type well 104, so that the first differential varactor units 119 and the second differential varactor units 141 are electrically connected in parallel. It should be noted that the gates electrically connected to the different gate voltages are alternatively disposed, and the first differential varactor units 119 and the second varactor units 141 are disposed in the same N-type well 104 in the differential varactor device 100 of this embodiment. For this reason, the differential varactor device 100 has a tuning ratio larger than 4, and the adjustable capacitance range of the differential varactor device 100 can be effectively raised.

In other embodiments of the present invention, the differential varactor device 100 also can include a plurality of the first differential varactor units 119 arranged in the first direction 110, and can include a plurality of the second differential varactor units 141 arranged in the first direction 110. Furthermore, the differential varactor device 100 of the present invention is not limited to only have the first differential varactor units 119 and the second differential varactor units 141 arranged in the second direction 134, and also can include a plurality of differential varactor units arranged in the second direction 134.

The differential varactor device of the present invention is not limited to the above-mentioned embodiment. The following description continues to detail the other embodiments or modifications, and in order to simplify and show the difference between the other embodiments or modifications and the above-mentioned embodiment, the same numerals denote the same components in the following description, and the same parts are not detailed redundantly.

Figure 4:
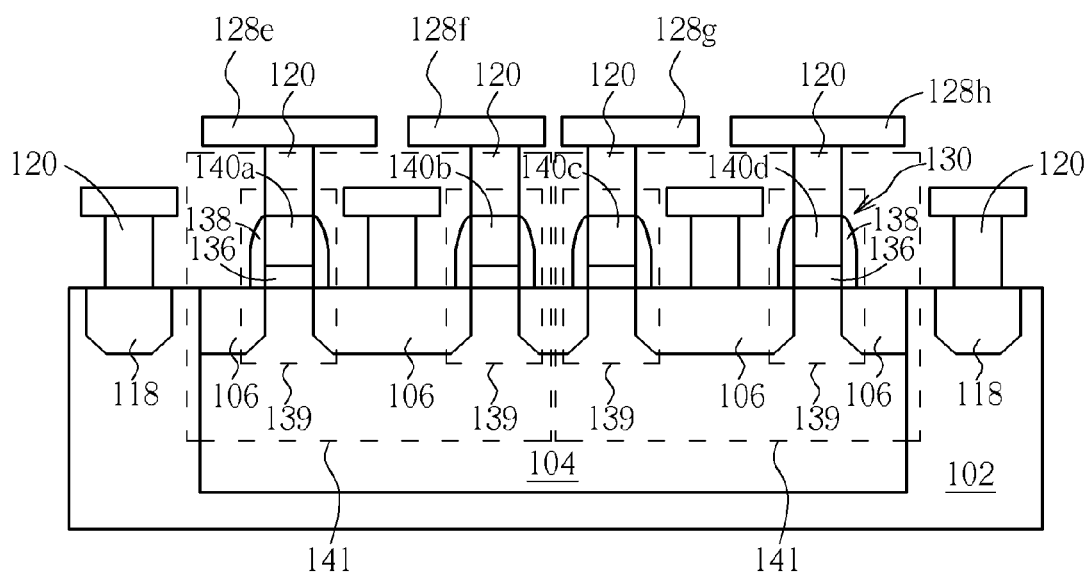
FIG. 4 is a schematic diagram illustrating a top view of a modification of the differential varactor device according to the first preferred embodiment of the present invention.

Please refer to FIG. 4, which is a schematic diagram illustrating a top view of a modification of the differential varactor device according to the first preferred embodiment of the present invention. As shown in FIG. 4, as compared with the above-mentioned embodiment, the N-type second doped region 132 of the modification can be an extension of the N-type first doped region 106, and the second gate structures 130 are respectively disposed between the adjacent N-type first doped regions 106.

Figure 5:
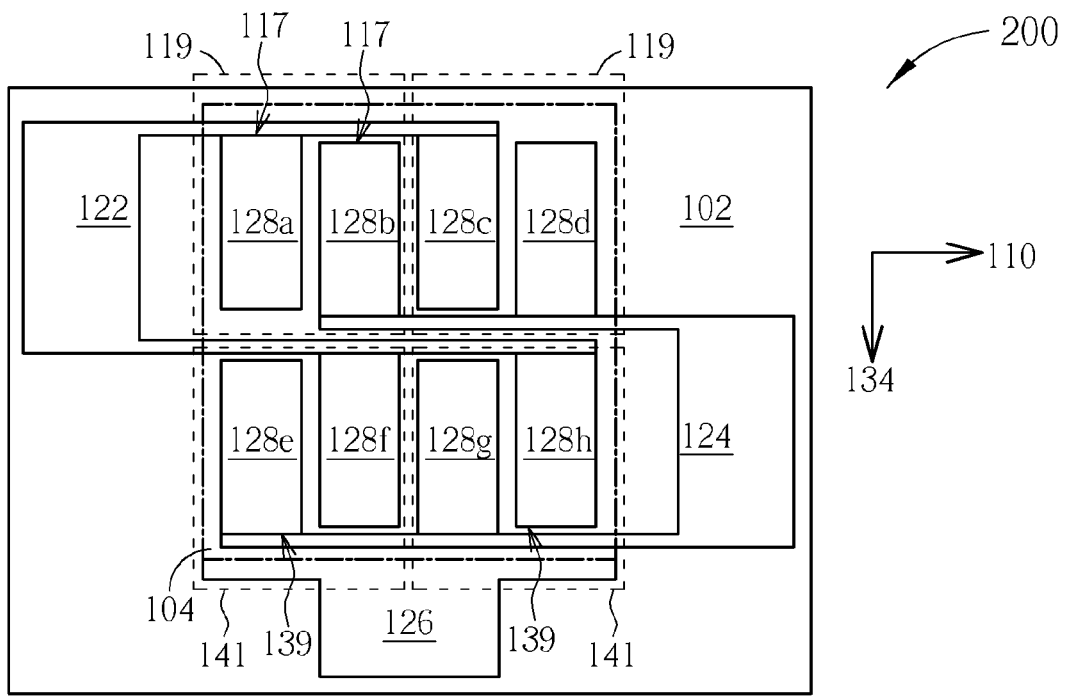
FIG. 5 is a schematic diagram illustrating a top view of a differential varactor device according to a second preferred embodiment of the present invention.

Please refer to FIG. 5, which is a schematic diagram illustrating a top view of a differential varactor device according to a second preferred embodiment of the present invention. As shown in FIG. 5, as compared with the first embodiment, in the differential varactor device 200 of this embodiment, the fifth conductive layer 128e and the seventh conductive layer 128g are electrically connected to the second output terminal 124, so the fifth gate 140a and the seventh gate 140c are electrically connected to the second output terminal 124. The sixth conductive layer 128f and the eighth conductive layer 128h are electrically connected to the first output terminal 122, so the sixth gate 140b and the eighth gate 138d are electrically connected to the first output terminal 122.

Figure 6:
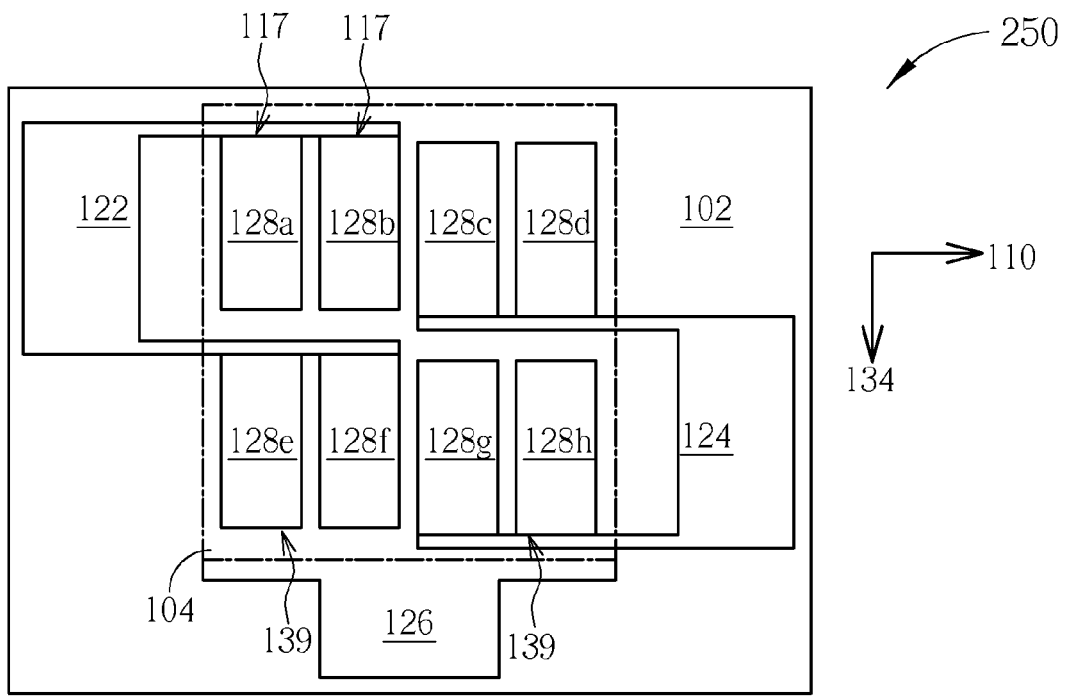
FIG. 6 is a schematic diagram illustrating a top view of a differential varactor device according to a third preferred embodiment of the present invention.

Please refer to FIG. 6, which is a schematic diagram illustrating a top view of a differential varactor device according to a third preferred embodiment of the present invention. As shown in FIG. 6, as compared with the first embodiment, in the differential varactor device 250, the first conductive layer 128a, the second conductive layer 128b, the fifth conductive layer 128e, and the sixth conductive layer 128f are electrically connected to the first output terminal 122, so the first gate 114a, the second gate 114b, the fifth gate 140a and the sixth gate 140c are electrically connected to the first output terminal 124. The third conductive layer 128c, the fourth conductive layer 128d, the seventh conductive layer 128g and the eighth conductive layer 128h are electrically connected to the second output terminal 124, so the third gate 114c, the fourth gate 114d, the seventh gate 140c and the eighth gate 140d are electrically connected to the second output terminal 124. In this embodiment, the first gate 114a and the second gate 114b adjacent thereto and the fifth gate 140a and the sixth gate 140b adjacent thereto are electrically connected to the same first output terminal 122, and the third gate 114c and the fourth gate 114d adjacent thereto and the fifth gate 140c and the sixth gate 140d adjacent thereto are electrically connected to the same second output terminal 124. Accordingly, the first gate 114a and the second gate 114b electrically connected to the first output terminal 122 and the third gate 114c and the fourth gate 114d electrically connected to the second output terminal 124 are arranged alternatively in the first direction 110. Similarly, the fifth gate 140a and the sixth gate 140b electrically connected to the first output terminal 122 and the seventh gate 140c and the eighth gate 140d electrically connected to the second output terminal 124 are arranged alternatively in the first direction 110.

Figure 7:
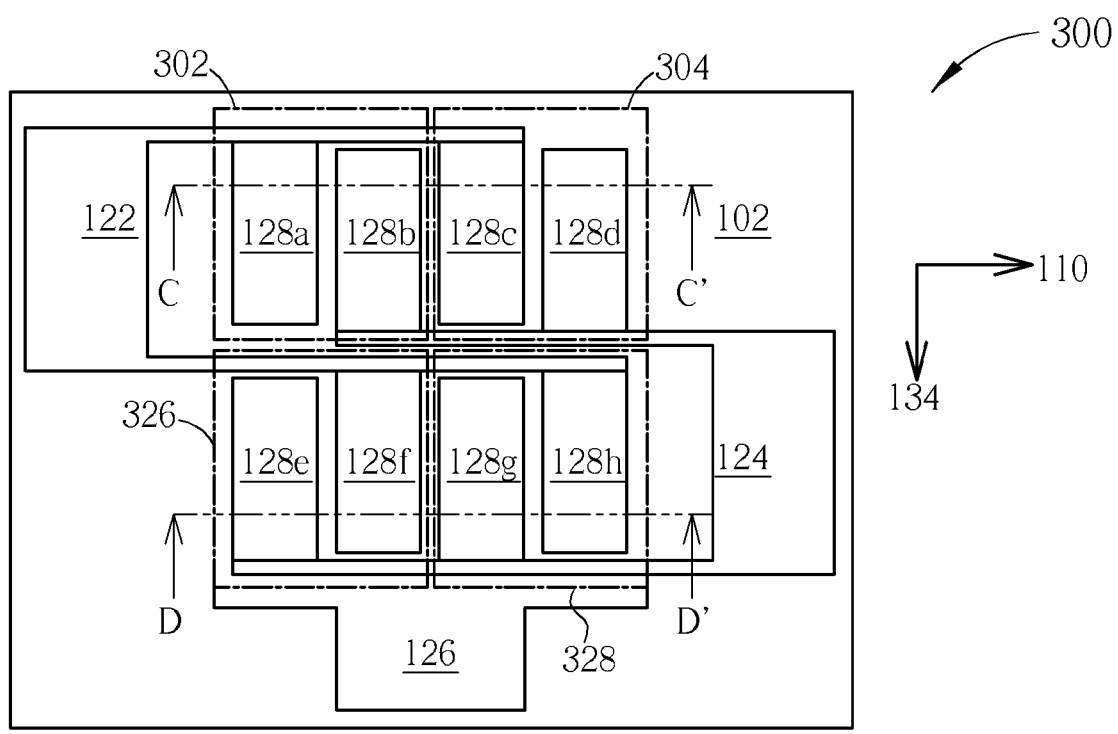
FIG. 7 is a schematic diagram illustrating a top view of a differential varactor device according to a fourth preferred embodiment of the present invention.
Figure 8:
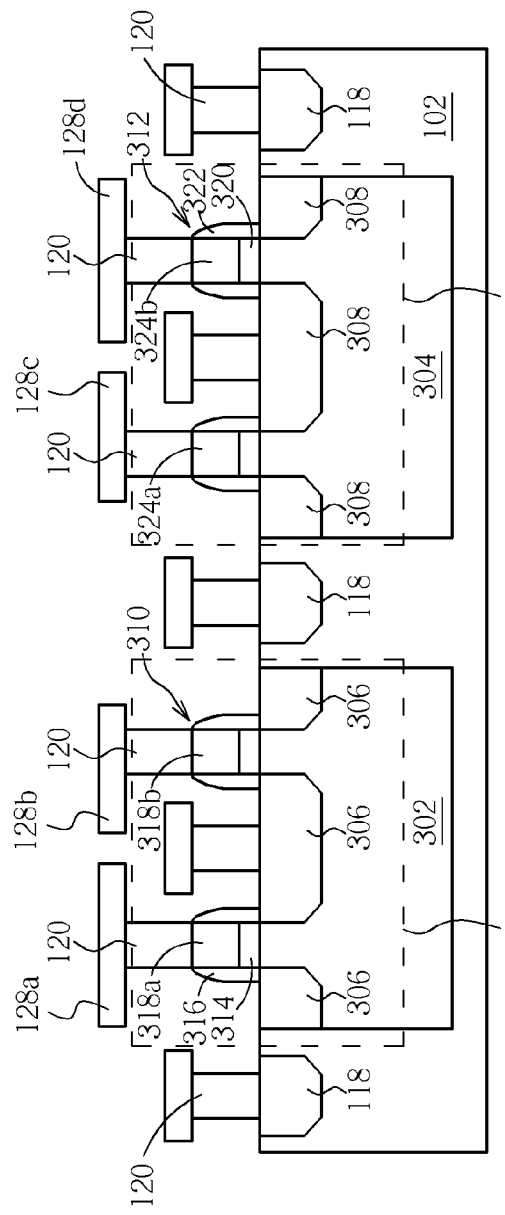
FIG. 8 is a schematic diagram illustrating a cross section of FIG. 7 along a cross-sectional line CC'.
Figure 9:
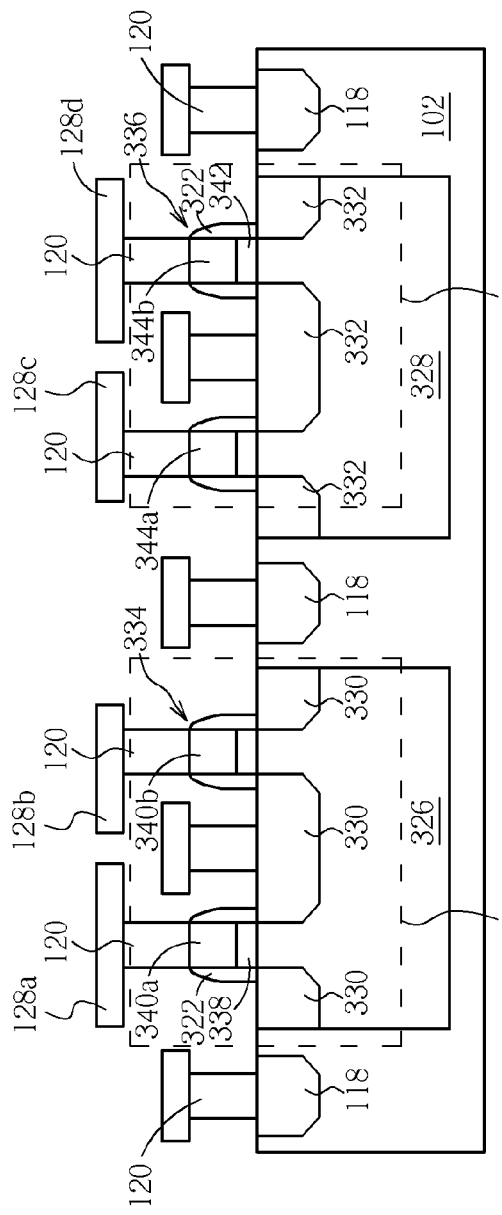
FIG. 9 is a schematic diagram illustrating a cross section of FIG. 7 along a cross-sectional line DD'.

Please refer to FIG. 7 through FIG. 9. FIG. 7 is a schematic diagram illustrating a top view of a differential varactor device according to a fourth preferred embodiment of the present invention. FIG. 8 is a schematic diagram illustrating a cross section of FIG. 7 along a cross-sectional line CC', and FIG. 9 is a schematic diagram illustrating a cross section of FIG. 7 along a cross-sectional line DD'. As shown in FIG. 7 and FIG. 8, as compared with the first embodiment, the differential varactor units are respectively disposed in different wells in the differential varactor device 300 of this embodiment. The differential varactor device 300 of this embodiment includes an N-type first well 302, an N-type second well 304, three N-type third doped region 306, three N-type fourth doped region 308, two third gate structures 310, and two fourth gate structure 312. The N-type first well 302 and the N-type second well 304 are disposed in the P-type substrate 102 and arranged in the first direction 110. The N-type third doped regions 306 are disposed in the N-type first well 302 and arranged in the first direction 110, and the N-type fourth doped regions 308 are disposed in the N-type second well 304 and arranged in the first direction 110.

In addition, each third gate structure 310 is disposed on the N-type first well 302 and located between any two of the adjacent N-type third doped regions 306 respectively. Each third gate structure 310 includes a third insulating layer 314, a gate, and two third spacers 316. Each gate is respectively disposed on each third insulating layer 314, and the third spacers 316 are respectively disposed on two sides of each gate and each third insulating layer 314. Furthermore, the gates of the third gate structure 310 can be divided into a first gate 318a and a second gate 318b that are electrically connected to the first output terminal 122 and the second output terminal 124 respectively. Also, the N-type first well 302 is electrically connected to the third output terminal 126 through the N-type third doped region 306 disposed between the first gate 318a and the second gate 318b. Accordingly, the N-type first well 302, the N-type third doped regions 306, and the third gate structures 310 constitute a third differential varactor unit 319.

Each fourth gate structure 312 is disposed on the N-type second well 304 and located between any two of the adjacent N-type fourth doped regions 308 respectively. Each third gate structure 312 includes a fourth insulating layer 320, a gate, and two fourth spacers 322. Each gate is respectively disposed on each fourth insulating layer 320, and the fourth spacers 322 are respectively disposed on two sides of each gate and each fourth insulating layer 320. Furthermore, the gates of the fourth gate structure 312 can be divided into a third gate 324a and a fourth gate 324b, and the first gate 318a, the second gate 318b, the third gate 324a, and the fourth gate 324b are arranged sequentially in the first direction 110. that are arranged in the first direction 110. The third gate 324a is electrically connected to the first output terminal 122, and the fourth gate 324b is electrically connected to the second output terminal 124. Also, the N-type second well 304 is electrically connected to the third output terminal 126 through the N-type fourth doped region 308 disposed between the third gate 324a and the fourth gate 324b. Accordingly, the N-type second well 304, the N-type fourth doped regions 308, and the fourth gate structures 312 constitute a fourth differential varactor unit 325.

As shown in FIG. 9, the differential varactor device 300 of this embodiment further includes an N-type third well 326, an N-type fourth well 328, three fifth doped regions 330, three N-type sixth doped region 332, two fifth gate structures 334, and two sixth gate structures 336. The N-type third well 326 and the N-type fourth well 328 are disposed in the P-type substrate 102 and arranged in the first direction 110. The N-type fifth doped regions 330 are disposed in the N-type third well 326 and arranged in the first direction 110. The N-type sixth doped regions 332 are disposed in the N-type fourth well 328 and arranged in the first direction 110. The fifth gate structures 334 are disposed on the N-type third well 326, and each gate structure 334 is located between any two of the adjacent N-type fifth doped regions 330. The fifth gate structures 334 and the third gate structures 310 are arranged in the second direction 134. Each fifth gate structure 334 includes a fifth insulating layer 338, and a gate disposed on the fifth insulating layer 338, and the gates of the fifth gate structures 334 can be divided into a fifth gate 340a and a sixth gate 340b. The sixth gate structures are disposed on the N-type fourth well 328, and each sixth gate structure 336 is located between any two of the adjacent N-type sixth doped regions 332. The sixth gate structures 336 and the fourth gate structures 312 are arranged in the second direction 134, and each gate structure 336 includes a sixth insulating layer 342, and a gate disposed on the sixth insulating layer 342. Also, the gates of the sixth gate structures 336 can be divided into a seventh gate 344a and an eighth gate 344b. The fifth gate 340a, the sixth gate 340b, the seventh gate 344a, and the eighth gate 344b are arranged sequentially in the first direction 110. In this embodiment, the fifth gate 340a and the seventh gate 344a are electrically connected to the first output terminal 122, and the sixth gate 340b and the eighth gate 344b are electrically connected to the second output terminal 124. The N-type third well 326 and the N-type fourth well 328 are electrically connected to the third output terminal 126 through the N-type fifth doped region 330 disposed between the fifth gate 340a and the sixth gate 340b and the N-type sixth doped region 332 disposed between the seventh gate 344a and the eighth gate 344b. Accordingly, the N-type third well 326, the N-type fifth doped regions 330 and the fifth gate structures 334 constitute a fifth differential varactor unit 345, and the N-type fourth well 328, the N-type sixth doped regions 332 and the sixth gate structures 336 constitute a sixth differential varactor unit 346.

Figure 10:
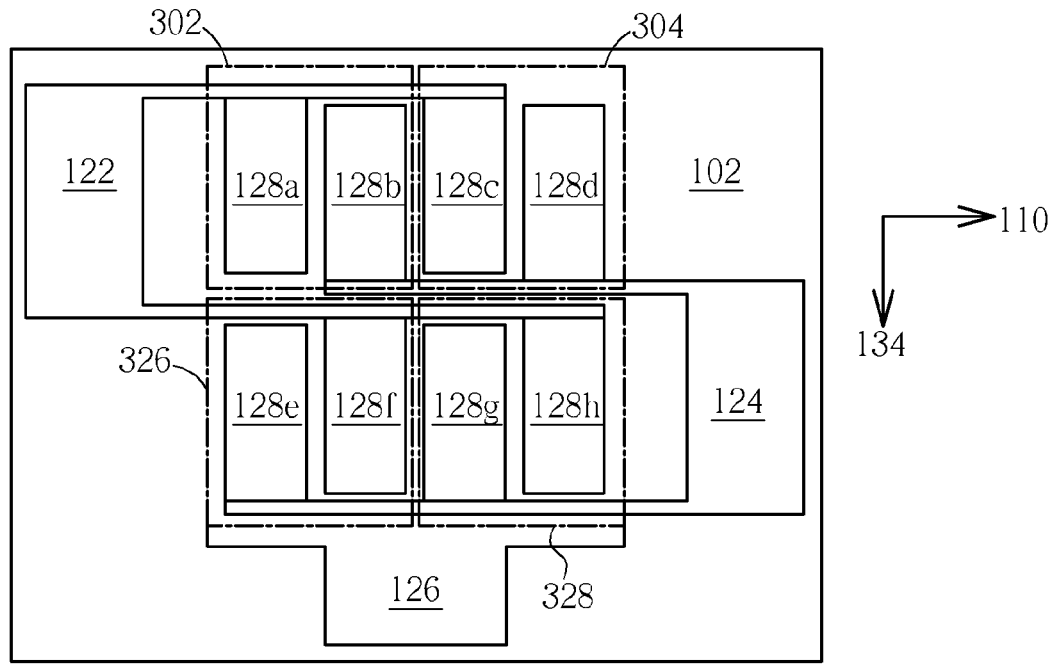
FIG. 10 is a schematic diagram illustrating a top view of a differential varactor device according to a fifth preferred embodiment of the present invention.
Figure 11:
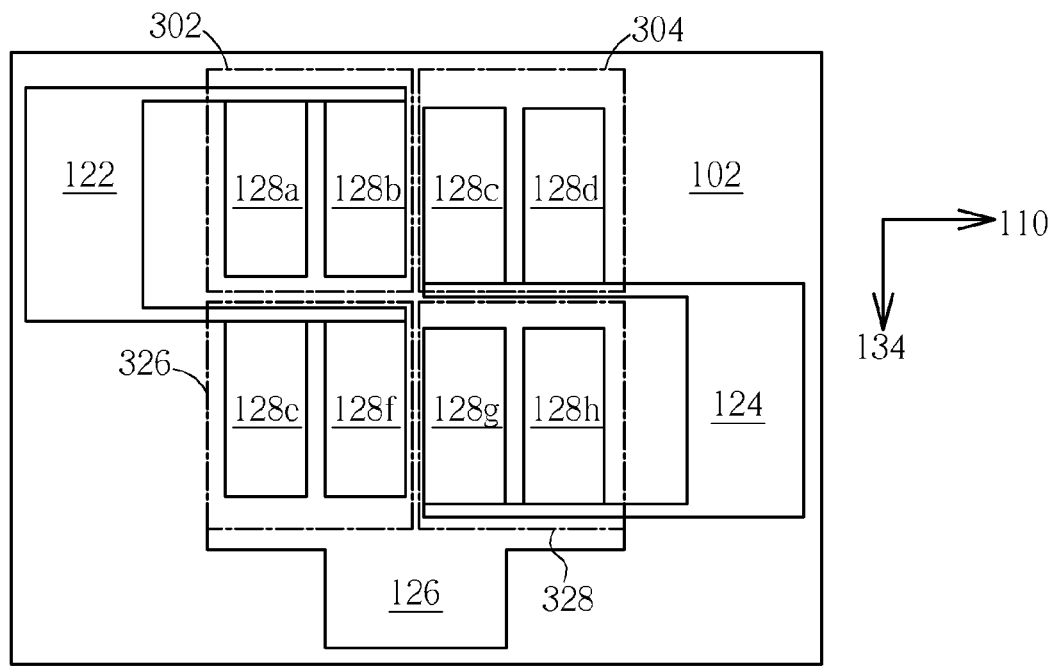
FIG. 11 is a schematic diagram illustrating a top view of a differential varactor device according to a sixth preferred embodiment of the present invention.

Please refer to FIG. 10 and FIG. 11. FIG. 10 is a schematic diagram illustrating a top view of a differential varactor device according to a fifth preferred embodiment of the present invention, and FIG. 11 is a schematic diagram illustrating a top view of a differential varactor device according to a sixth preferred embodiment of the present invention. As shown in FIG. 10, as compared with the fourth embodiment, the fifth conductive layer 128e and the seventh conductive layer 128g are electrically connected to the second output terminal 124, so the fifth gate 340a and the seventh gate 344a are electrically connected to the second output terminal 124. The sixth conductive layer 128f and the eighth conductive layer 128h are electrically connected to the first output terminal 122, so the sixth gate 340b and the eighth gate 344b are electrically connected to the first output terminal 122. As shown in FIG. 11, as compared with the fourth embodiment, the first conductive layer 128a, the second conductive layer 128b, the fifth conductive layer 128e, and the sixth conductive layer 128f are electrically connected to the first output terminal 122, so the first gate 318a, the second gate 318b, the fifth gate 340a and the sixth gate 340b are electrically connected to the first output terminal 122. The third conductive layer 128c, the fourth conductive layer 128d, the seventh conductive layer 128g and the eighth conductive layer 128h are electrically connected to the second output terminal 124, so the third gate 324a, the fourth gate 324d, the seventh gate 344a and the eighth gate 344b are electrically connected to the second output terminal 124.

The effect of the differential varactor devices according to the above-mentioned embodiments of the present invention will be further compared in the following description. Please refer to Table 1, and a maximum capacitance, a minimum capacitance and a tuning ratio, which is a ratio of the maximum capacitance to a minimum capacitance, of the differential varactor devices when the differential varactor devices operates at a frequency of 10 GHz according to the above-mentioned embodiments are set forth in Table 1. As shown in Table 1, when two gates electrically connected to a gate voltage and two gates electrically connected to another gate voltage are arranged alternatively in the first direction, the tuning ratio of the differential varactor device is larger than 3.68. Furthermore, when the gates electrically connected to different gate voltages are arranged alternatively in the first direction, and different differential varactor units are disposed in different N-type wells respectively, the tuning ratio of the differential varactor device is larger than 4.13. Moreover, when the gates electrically connected to different gate voltages are arranged alternatively in the first direction, and different differential varactor units are disposed in the same N-type well, the tuning ratio of the differential varactor device is larger than 4.83. Therefore, the tuning ratio of the differential varactor device in the present invention can be effectively raised, and the adjustable capacitance range of the differential varactor device can be increased.

TABLE 1

| embodiment | maximum capacitance (farad) | minimum capacitance (farad) | tuning ratio |
| --- | --- | --- | --- |
| the first preferred embodiment | $5.57 \times 10^{-14}$ | $2.67 \times 10^{-13}$ | 4.8 |
| the second preferred embodiment | $5.44 \times 10^{-14}$ | $2.63 \times 10^{-13}$ | 4.83 |
| the third preferred embodiment | $5.24 \times 10^{-14}$ | $2.46 \times 10^{-13}$ | 4.69 |
| the fourth preferred embodiment | $5.39 \times 10^{-14}$ | $2.26 \times 10^{-13}$ | 4.19 |
| the fifth preferred embodiment | $5.37 \times 10^{-14}$ | $2.21 \times 10^{-13}$ | 4.13 |
| the sixth preferred embodiment | $5.12 \times 10^{-14}$ | $1.88 \times 10^{-13}$ | 3.68 |

In summary, the gates electrically connected to different gate voltages are arranged alternatively in a direction, and the different differential varactor units are disposed in the same well in the differential varactor device of the present invention, so the tuning ratio of the differential varactor device can be larger than 4, and the adjustable capacitance range of the differential varactor device can be effectively increased.

Those skilled in the art will readily observe that numerous modifications and alterations of the device and method may be made while retaining the teachings of the invention.

What is claimed is:

1. A differential varactor device, comprising:
   a substrate, having a first conductive type;
   a well, disposed in the substrate, and the well having a second conductive type;
   five first doped regions, disposed in the well and arranged in a first direction, and the first doped regions having the second conductive type; and
   a first gate, a second gate, a third gate and a fourth gate, respectively disposed on the well between any two of the adjacent first doped regions and arranged sequentially in the first direction, wherein the first gate and the third gate are electrically connected to a first output terminal, the second gate and the fourth gate are electrically connected to a second output terminal different from the first output terminal, and the first output terminal and the second output terminal are not electrically connected to the first doped regions.

2. The differential varactor device according to claim 1, further comprising:
   a fifth gate, a sixth gate, a seventh gate, and an eighth gate, disposed on the well, and arranged sequentially in the first direction, and the fifth gate, the sixth gate, the seventh gate and the eighth gate are arranged respectively with the first gate, the second gate, the third gate and the fourth gate in a second direction.

3. The differential varactor device according to claim 2, wherein the fifth gate and the seventh gate are electrically connected to the first output terminal, and the sixth gate and the eighth gate are electrically connected to the second output terminal.

4. The differential varactor device according to claim 2, wherein the fifth gate, the sixth gate, the seventh gate and the eighth gate are respectively disposed between any two of the adjacent first doped regions.

5. The differential varactor device according to claim 2, further comprising five second doped regions, disposed in the well, and the second doped regions having the second conductive type, wherein the fifth gate, the sixth gate, the seventh gate and the eighth gate are respectively disposed between any two of the adjacent second doped regions.

6. The differential varactor device according to claim 5, wherein the second doped regions disposed between the fifth gate and the sixth gate and disposed between the seventh gate and the eighth gate are electrically connected to a third output terminal.

7. The differential varactor device according to claim 1, the first doped regions disposed between the first gate and the second gate and disposed between the third gate and the fourth gate are electrically connected to a third output terminal.

8. The differential varactor device according to claim 1, wherein the first gate, the second gate, the third gate and the fourth gate are respectively composed of a polysilicon layer.

9. A differential varactor device, comprising:
   a plurality of differential varactor units, respectively having two gates disposed adjacent to each other, and the gates of each differential varactor unit being electrically connected to a first output terminal and a second output terminal respectively, wherein each gate electrically connected to the first output terminal and each gate electrically connected to the second output terminal are arranged alternatively along a direction, the differential varactor device have a tuning ratio, and the tuning ratio is larger than 4; and
   a well, and the differential varactor units are disposed in the well.

* * * * *